(12) United States Patent
Minzoni (10) Patent No.: US 7,227,396 B2
(45) Date of Patent: Jun. 5, 2007

(54) CLOCK SIGNAL INPUT/OUTPUT DEVICE FOR CORRECTING CLOCK SIGNALS

(75) Inventor: Alessandro Minzoni, Xi'an (CN)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/374,990

(22) Filed: Mar. 15, 2006

(65) Prior Publication Data
US 2006/0214716 A1    Sep. 28, 2006

Related U.S. Application Data

(63) Continuation of application No. PCT/EP2004/052937, filed on Nov. 12, 2004.

(51) Int. Cl.
*H03K 5/01* (2006.01)
(52) U.S. Cl. .................................. 327/165; 327/291
(58) Field of Classification Search ................ 327/236, 327/256, 165–167, 291
See application file for complete search history.

(56) References Cited

U.S. PATENT DOCUMENTS

| 3,778,550 | A |   | 12/1973 | David |         |
|-----------|---|---|---------|-------|---------|
| 4,881,243 | A |   | 11/1989 | Whitt |         |
| 5,471,167 | A | * | 11/1995 | L'Hermite et al. | 327/538 |
| 6,349,111 | B1| * | 2/2002  | Huloux | 375/222 |
| 6,426,660 | B1|   | 7/2002  | Ho et al. |     |

FOREIGN PATENT DOCUMENTS

| DE | 43-05-244 A1 | 8/1994 |
| DE | 4305244 A1 | 8/1994 |
| EP | 0964517 A2 | 12/1999 |

OTHER PUBLICATIONS

Jang, Y. C. et al. (2003). "CMOS Digital Duty Cycle Correction Circuit for Multi-phase Clock," *Electronics Letters* 39(19), 2 pages.
International Preliminary Report on Patentability mailed on Oct. 13, 2005 for International Patent Application No. PCT/EP2004/052937 filed on Nov. 12, 2004.

\* cited by examiner

*Primary Examiner*—Dinh T. Le
(74) *Attorney, Agent, or Firm*—Morrison & Foerster LLP (57) ABSTRACT

The invention relates to a clock signal correction method, and to a clock signal input/output device into which a clock signal or a signal obtained therefrom is input and transmitted to a frequency divider, wherein a signal output by the frequency divider is transmitted to a signal integrator, and wherein a signal output by the signal integrator is transmitted to a first signal comparison circuit, wherein the signal output by the frequency divider is additionally transmitted to a second signal comparison circuit, and wherein the clock signal input/output device additionally comprises a signal input circuit for outputting a clock output signal as a function of a signal output by the first signal comparison circuit, and of a signal output by the second signal comparison circuit.

10 Claims, 4 Drawing Sheets

CLOCK SIGNAL INPUT/OUTPUT DEVICE FOR CORRECTING CLOCK SIGNALS

CLAIM FOR PRIORITY

This application is a Continuation of prior PCT application No. PCT/EP2004/052937 filed Nov. 12, 2004 which was published on Jun. 2, 2005 and which claims the benefit of priority to German Application No. 103 54 818.1 filed Nov. 24, 2003.

TECHNICAL FIELD OF THE INVENTION

The invention relates to a clock signal input/output device, in particular for correcting clock signals, and to a clock signal correction method.

BACKGROUND OF THE INVENTION

In semi-conductor devices, in particular in memory devices such as DRAMs (DRAM=Dynamic Random Access Memory and/or dynamic read/write memory) based on CMOS technology, so-called clock signals are used for the chronological co-ordination of the processing or relaying of the data.

Conventional semiconductor devices in general use a single clock signal present on a single line (i.e. a so-called "single-ended" clock signal), for this purpose.

The data may then, for instance, be relayed at the respective rising edge of the single-ended clock signal (or, alternatively, e.g. at the respective falling edge of the single-ended clock signal).

Further, so-called DDR devices, in particular DDR-DRAMs (DDR-DRAM=Double Data Rate DRAM) are already known in prior art.

In DDR devices—instead of one single clock signal present on a single line ("single ended" clock signal)—two differential, oppositely inverse clock signals present on two separate lines are used.

Every time, for instance, when the first of the two clock signals changes from a "logic high" state (e.g. a high voltage level) to a "logic low" state (e.g. a low voltage level), the second clock signal—substantially simultaneously—changes its state from "logic low" to "logic high" (e.g. from a low to a high voltage level).

Conversely, whenever the first clock signal changes from a "logic low" state (e.g. a low voltage level) to a "logic high" state (e.g. a high voltage level), the second clock signal (again substantially simultaneously) changes its state from "logic high" to "logic low" (e.g. from a high to a low voltage level).

With DDR devices, the data are, in general, relayed both at the rising edge of the first clock signal and at the rising edge of the second clock signal (or both at the falling edge of the first clock signal and at the falling edge of the second clock signal).

This means that data are relayed more frequently and/or faster (in particular twice as frequently and/or twice as fast) in a DDR device than in corresponding, conventional devices using a "single ended" clock signal, i.e. the data rate is higher, in particular twice as high, as that of corresponding, conventional devices.

The clock signal ("DQS" or "data strobe" signal) used internally in the device for the chronological coordination of the processing and/or relaying of the data (or—when differential, oppositely inverse clock signals are used—the internal clock signal DQS and the clock signal BDQS that is oppositely inverse to the clock signal DQS) has to be synchronous to a clock signal ("clk" or "clock" signal) input externally into the device (or synchronous to the differential clock signals clk, bclk input externally into the device, respectively).

The external clock signal(s) clk, bclk is (are) generated by an appropriate clock signal generator that is connected to the device.

For synchronizing the internally generated clock signal DQS or the internally generated clock signals DQS, BDQS, respectively, with the external clock signal(s) clk, bclk, a clock signal synchronizing device, e.g. a DLL circuit (DLL=Delay Locked Loop) is used. Such a circuit is, for instance, known form EP 964 517.

A clock signal synchronizing device may e.g. comprise a first delay means into which the external clock signal(s) clk, bclk is/are input, and which loads the input clock signal(s)—depending on a control signal output by the phase comparator—with a variable delay time $t_{var}$ that is adjustable by the control signal.

The signal(s) output by the first delay means may be used—internally—in the device for the chronological coordination of the processing and/or relaying of the data (i.e. as—internal—clock signal(s) DQS or BDQS).

The signal DQS output by the first delay means is fed to a second delay means that loads the input signal DQS with a—fixed—delay time $t_{const}$ that corresponds approximately to the sum of the signal delays caused by the receiver(s) ("receiver delay"), the respective data path ("data path delay"), and the off-chip driver(s) ("OCD delay").

The signal (FB signal or "feedback signal") output by the second delay means is fed to the above-mentioned phase comparator. There, the phasing of the FB signal is compared with the phasing of the clk signal that is also input in the phase comparator 4. Depending on whether the phase of the FB signal is faster or slower than that of the clk signal, the phase comparator outputs—as a control signal for the above-mentioned first delay means—an incrementing signal (INC signal) or a decrementing signal (DEC signal), said signals having the effect that the delay $t_{var}$ of the clk signal caused by the first signal delay means is increased in the case of an INC signal and decreased in the case of a DEC signal, so that, finally, the clk signal and the FB signal are synchronized, i.e. the clock signal synchronizing device is "locked".

In particular at high frequencies, there can be relatively strong distortions of the clock signal clk—that is provided by the above-mentioned external clock signal generator—(or of the—externally provided, differential—clock signals clk, bclk, respectively). These result, for instance, in that the "logic low" state of the clk signal is e.g. shorter (or e.g. longer) than the "logic high" state of the clk signal (and e.g. the "logic low" state of the bclk signal is e.g. longer (or e.g. shorter) than the "logic high" state of the bclk signal). Consequently, the—internal—clock signal DQS or BDQS obtained by the above-mentioned clock signal synchronizing device, e.g. the DLL circuit, from the external clock signal clk or bclk is also relatively strongly distorted.

SUMMARY OF THE INVENTION

The invention to provides a clock signal input/output device, and a novel clock signal correction method, in particular a device and a method by means of which less distorted or substantially undistorted clock signals can be obtained from a distorted external clock signals clk, bclk.

In accordance with one embodiment of the invention, there is a clock signal input/output device into which a clock signal (clk) or a signal obtained therefrom is input and transmitted to a frequency divider, wherein a signal (clk2) output by the frequency divider or a signal obtained therefrom, is transmitted to a signal integrator, and wherein a signal (I2) output by the signal integrator or a signal obtained therefrom is transmitted to a first signal comparison circuit, wherein the signal (clk2) output by the frequency divider or the signal obtained therefrom is additionally transmitted to a second signal comparison circuit, and wherein the clock signal input/output device additionally comprises a signal output circuit for outputting a clock output signal (clk50) as a function of a signal (rIclk) output by the first signal comparison circuit or a signal obtained therefrom, and of a signal (rclk) output by the second signal comparison circuit or a signal obtained therefrom.

BRIEF DESCRIPTION OF THE DRAWINGS

The invention will be explained in more detail with reference to exemplary embodiments and the drawings. The drawings show.

DETAILED DESCRIPTION OF THE INVENTION

Figure 1:
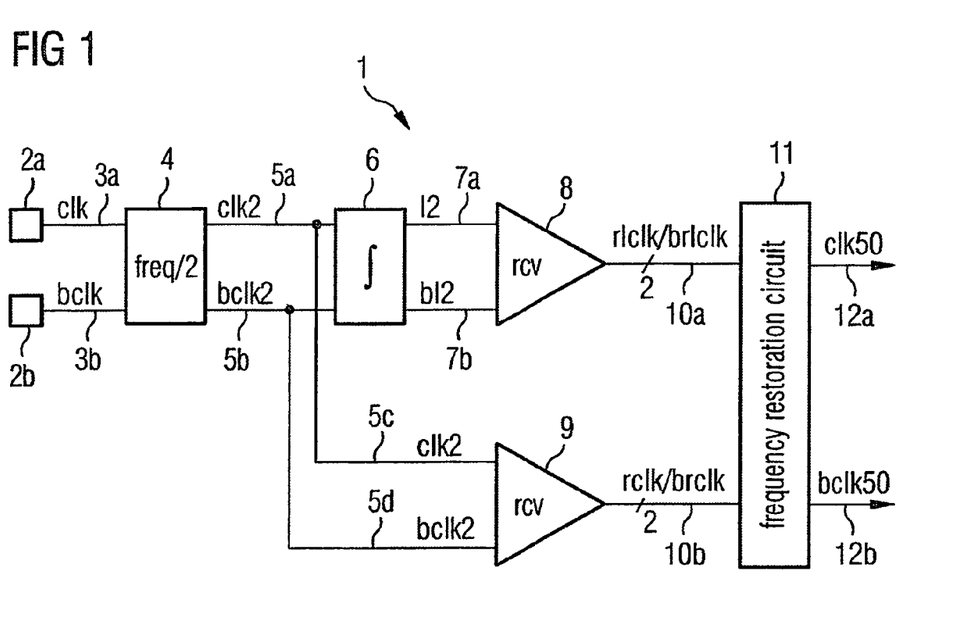
FIG. 1 shows a clock signal input/output device according to the invention.

FIG. 1 shows a clock signal input/output device 1 or of a clock signal correction device 1, respectively, according to an embodiment of the invention.

The device comprises a frequency divider 4, a signal integrator 6, two—identically or substantially identically structured—signal comparison or signal receiver circuits 8, 9, and a frequency restoration circuit 11.

The clock signal input/output device 1 may, for instance, be provided on a semiconductor device, in particular a memory device such as a DRAM (DRAM=Dynamic Random Access Memory or dynamic read-write memory) based on CMOS technology, e.g. a DDR-DRAM (DDR-DRAM=Double Data Rate- DRAM).

The corresponding semiconductor device comprises an—external—connection 2a (e.g. an appropriate pad or an appropriate pin), at which—for the chronological coordination of the processing and/or relaying of the data in the semiconductor device—an external clock signal clk is applied by an external clock generator.

Furthermore, the device comprises a corresponding—further—external connection 2b (e.g. an appropriate further pad or an appropriate further pin), at which—e.g. by the above-mentioned external clock generator—a further external signal bclk is applied. The clock signals clk, bclk may be oppositely inverse to one another (i.e. the clock signals may be so-called "differential" clock signals clk, bclk).

Internally in the device, the data may, for instance, each be relayed both at the rising edge of the clk clock signal and at the rising edge of the bclk clock signal (or both at the rising edge of a DQS signal obtained therefrom and at the rising edge of a BDQS signal obtained therefrom (or—alternatively—e.g. at the respective falling clock edges of the corresponding signals)).

As is illustrated in FIG. 1, the clk signal present at the connection 2a of the semiconductor device is—possibly by the interposition of an appropriate receiver circuit—fed to a first input of the frequency divider 4 via a line 3a.

Furthermore, the bclk signal present at the connection 2b of the semiconductor device is—possibly also by the interposition of the above-mentioned receiver circuit—fed to a second input of the frequency divider 4 via a line 3b.

A first output of the frequency divider 4—at which there is output a signal clk2 having half the frequency f/2 of the frequency f of the signal clk—is connected to a first input of the signal integrator 6 via a line 5a.

Figure 3:
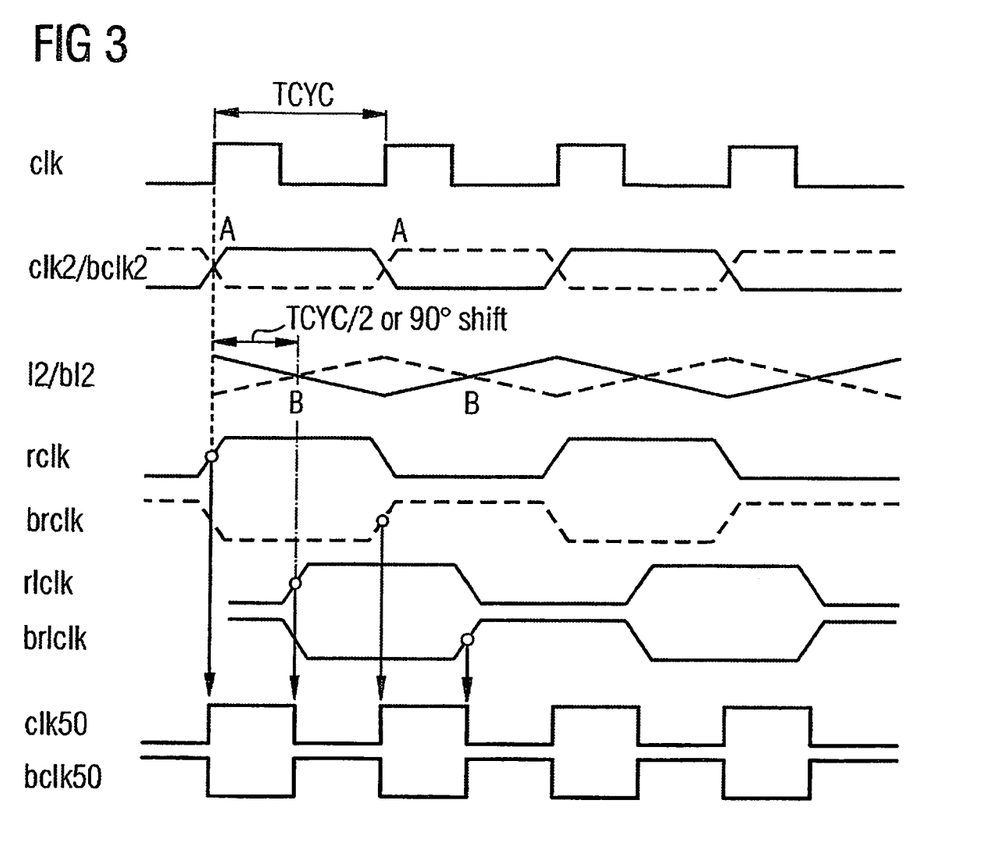
FIG. 3 shows timing charts of the signals clk or bclk input into the clock signal input/output device illustrated in FIGS. 1 and 2, of the signals generated internally in the device, and of the signals output by the device.

By the frequency division obtained by the frequency divider 4 it is achieved that—as is illustrated in FIG. 3—the signal clk2 changes its state e.g. at a respective positive edge of the clk signal (e.g. at a first positive edge of the clk signal from "logic low" to "logic high", and at a second, subsequent positive edge of the clk signal back from "logic high" to "logic low").

Furthermore, a second output of the frequency divider 4 (at which a signal bclk2 having half the frequency f/2 of the frequency f of the signal bclk and being oppositely inverse to the signal clk2 is output) is connected to a second input of the signal integrator 6 via a line 5b.

By the frequency division obtained by the frequency divider 4 it is achieved that—as is illustrated in FIG. 3—the signal bclk2 changes its state e.g. at a respective positive edge of the clk signal (e.g. the signal bclk2 changes its state at a first positive edge of the clk signal—contrary to the signal clk2—from "logic high" to "logic low", and at a second, subsequent positive edge of the clk signal—contrary to the signal clk2—back from "logic low" to "logic high").

As results further from FIG. 1, a first output of the signal integrator 6—at which a signal I2 obtained e.g. by an appropriate integration from the signal clk is output—is connected via a line 7a to a first input of the above-mentioned signal comparison circuit 8.

Furthermore, a second output of the signal integrator 6—at which a signal bI2 obtained e.g. by an appropriate integration from the signal bclk and proceeding inversely to the signal I2 is output—is connected via a line 7b to a second input of the above-mentioned signal comparison circuit 8.

As signal comparison or signal receiver circuits 8, 9, any signal comparison circuits or signal receiver circuits may, on principle, be used, e.g. receiver circuits that are constructed correspondingly similar as corresponding conventional clock receiver circuits, comprising e.g. four cross-coupled transistors (e.g. a first and a second p-channel field effect transistor, and a first and a second n-channel field effect transistor).

The sources of the first and second n-channel field effect transistors may, for instance, be connected to a (direct or constant) current source that is e.g. connected with the mass potential.

Furthermore, the gate of the first n-channel field effect transistor may, for instance, be connected with the above-mentioned (first) input of the respective circuit 8, 9, and the gate of the second n-channel field effect transistor with the above-mentioned (second) input of the respective circuit 8, 9.

The drain of the first n-channel field effect transistor may, for instance, be connected to the gate of the first and second p-channel field effect transistors, and to the drain of the first p-channel field effect transistor, as well as to a (first) output of the respective circuit 8, 9 (at which—as is illustrated in FIG. 1—e.g. a signal rIclk or a signal rclk can be tapped).

Correspondingly, the drain of the second n-channel field effect transistor may, for instance, be connected to the drain of the second p-channel field effect transistor, and to a (second) output of the respective circuit 8, 9 (at which—as is illustrated in FIG. 1—e.g. a signal brIclk or brclk that is inverse to the signal rIclk or rclk can be tapped).

The sources of the first and second p-channel field effect transistors may, for instance, each be connected to the supply voltage.

As is illustrated in FIG. 1, the first output of the signal comparison circuit 8 is—e.g. via a first line of a corresponding line pair 10a—connected to the above-mentioned frequency restoration circuit 11.

Correspondingly, the second output of the signal comparison circuit 8 is—e.g. via a second line of the above-mentioned line pair 10a—connected to the above-mentioned frequency restoration circuit 11.

As results further from FIG. 1, the above-mentioned signal clk2—which has half the frequency f/2 of the frequency f of the signal clk—is fed, except via the line 5a to the first input of the signal integrator 6, additionally via a line 5c that is connected to the line 5a to a first input of the above-mentioned—second—signal comparison circuit 9.

Furthermore, the above-mentioned signal bclk2—which has half the frequency f/2 of the frequency f of the signal bclk—is fed, except via the line 5b to the second input of the signal integrator 6, additionally via a line 5d that is connected to the line 5b to a second input of the above-mentioned—second—signal comparison circuit 9.

A first output of the signal comparison circuit 9 is—e.g. via a first line of a corresponding, further line pair 10b—connected to the above-mentioned frequency restoration circuit 11.

Correspondingly, a second output of the signal comparison circuit 9 is—e.g. via a second line of the above-mentioned line pair 10b—connected to the frequency restoration circuit 11.

As is illustrated in FIG. 3, and as has already been mentioned above, the signals clk2 or bclk2, respectively, present at the line 5a or 5b, respectively, are integrated by the signal integrator 6.

The level of the signal I2 output by the signal integrator 6 at the line 7a therefore continues to increase linearly in the form of a ramp—from the time at which a negative edge occurs with the signal clk2—until a time at which a positive edge occurs with the signal clk2, which results in that—until the next negative edge of the clk2 signal—the level of the signal I2 output by the signal integrator 6 at the line 7a continues to decrease linearly in the form of a ramp.

The level of the signal bI2 output by the signal integrator 6 at the line 7b correspondingly inversely continues to decrease linearly in the form of a ramp from the time at which a negative edge occurs with the signal clk2 (or a positive edge with the signal bclk2), until the time at which a positive edge occurs with the signal clk2 (or a negative edge with the signal bclk2), which results in that—until the next negative edge of the clk2 signal—the level of the signal bI2 output by the signal integrator 6 at the line 7b continues to increase linearly in the form of a ramp.

As results further from FIG. 3, the signal comparison circuit 8 outputs, at the (first) output—and thus at the first line of the above-mentioned line pair 10a—a "logic low" signal rIclk whenever the level of the signal I2 is greater than the level of the signal bI2, and a "logic high" signal rIclk at the (first) output—and thus at the first line of the above-mentioned line pair 10a—whenever the level of the signal I2 is smaller than the level of the signal bI2.

Correspondingly vice versa, the signal comparison circuit 8 outputs, at the (second) output—and thus at the second line of the above-mentioned line pair 10a—a "logic low" signal brIclk whenever the level of the signal I2 is smaller than the level of the signal bI2, and a "logic high" signal brIclk at the (second) output—and thus at the second line of the above-mentioned line pair 10a—whenever the level of the signal I2 is greater than the level of the signal bI2.

Correspondingly similar—as also results from FIG. 3—the signal comparison circuit 9 outputs, at the (first) output—and thus at the first line of the above-mentioned line pair 10b—a "logic high" signal rclk whenever the level of the signal clk2 is greater than the level of the signal bclk2, and a "logic low" signal rclk at the (first) output—and thus at the first line of the above-mentioned line pair 10b—whenever the level of the signal clk2 is smaller than the level of the signal bclk2.

Correspondingly vice versa, the signal comparison circuit 9 outputs, at the (second) output—and thus at the second line of the above-mentioned line pair 10b—a "logic high" signal brclk whenever the level of the signal clk2 is smaller than the level o the signal bclk2, and a "logic low" signal brclk at the (second) output—and thus at the second line of the above-mentioned line pair 10b—whenever the level of the signal clk2 is greater than the level of the signal bclk2.

As results further from FIG. 3, a signal clk50 output by the frequency restoration circuit 11 at a line 12a changes its state from "logic low" to "logic high" when the signal rclk that is present at the first line of the line pair 10b changes its state from "logic low" to "logic high", and already then back to "logic low" when the signal rIclk that is present at the first line of the line pair 10a changes its state from "logic low" to "logic high". Furthermore, the signal clk50 output by the frequency restoration circuit 11 at the line 12a already changes its state from "logic low" to "logic high" when the signal brclk that is present at the second line of the line pair 10b changes its state from "logic low" to "logic high", and already then back to "logic low" when the signal brIclk that is present at the second line of the line pair 10a changes its state from "logic low" to "logic high" (in other words, there is a change of the signal state of the signal clk50 whenever one of the signals rclk, rIclk, brclk, or brIclk has a positive clock edge).

As results further from FIG. 3, a signal bclk50 output by the frequency restoration circuit 11 at a line 12 changes—correspondingly conversely—its state from "logic high" to "logic low" when the signal rclk that is present at the first line of the line pair 10b changes its state from "logic low" to "logic high" (or the signal brclk from "logic high" to "logic low"), and already then back to "logic high" when the signal rIclk that is present at the first line of the line pair 10a changes its state from "logic low" to "logic high" (or the signal brIclk from "logic high" to "logic low"). Furthermore, the signal bclk50 that is output by the frequency restoration circuit 11 at the line 12b already changes its state from "logic high" to "logic low" when the signal brclk that is present at the second line of the line pair 10b changes its state from "logic low" to "logic high" (or the signal rclk from "logic high" to "logic low") and already then back to "logic high" when the signal brIclk that is present at the second line of the line pair 10a changes its state from "logic low" to "logic high" (or the signal rIclk from "logic high" to "logic low") (in other words, there is a change of the signal state of the signal bclk50 whenever one of the signals rclk, rIclk, brclk, or brIclk has a positive clock edge (or—alternatively—a negative clock edge)).

Figure 5:
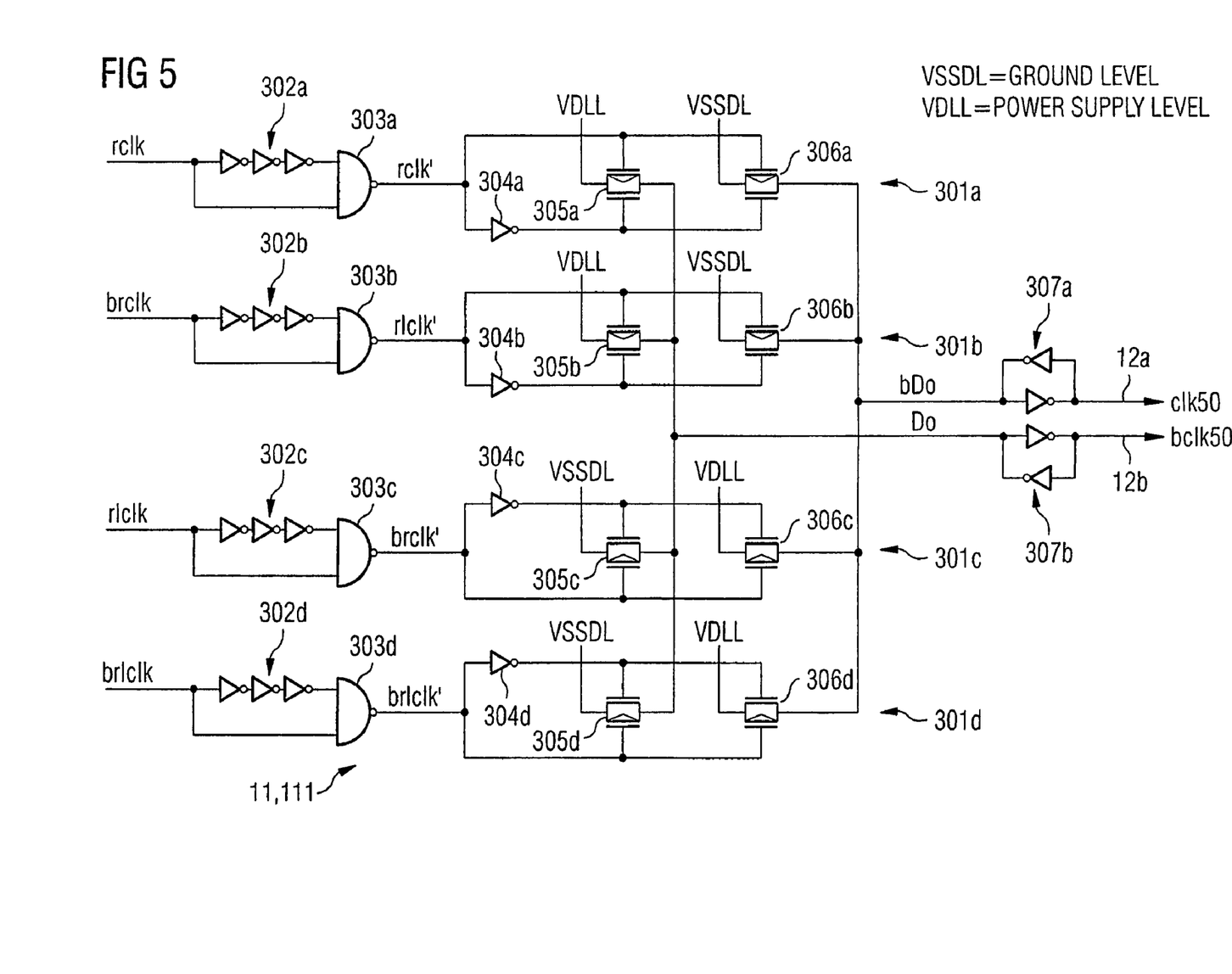
FIG. 5 shows the frequency restoration circuit illustrated in FIGS. 1 and 2.

FIG. 5 shows a detailed representation of the frequency restoration circuit 11.

It comprises four substantially identical, parallel circuit sections 301a, 301b, 301c, 301d for each of the four signals input into the frequency restoration circuit 11.

Each circuit section 301a, 301b, 301c, 301d comprises a delay means 302a, 302b, 302c, 302d (consisting each of an odd number of inverters), a NAND gate 303a, 303b, 303c, 303d, an (additional) inverter 304a, 304b, 304c, 304d, and two—complementarily connected—transmission gates 305a, 305b, 305c, 305d, and 306a, 306b, 306c, 306d, respectively.

As results from FIG. 5, the above-mentioned signals rclk, rIclk, brclk, or brIclk are each directly transmitted to a first input of the respective NAND gate 303a, 303b, 303c, 303d, and additionally—by the interposition of the respective delay means 302a, 302b, 302c, 302d—(i.e. in a manner delayed by the delay time ΔT effected by the delay means) to a second input of the respective NAND gate 303a, 303b, 303c, 303d.

A signal rclk', rIclk', brclk', or brIclk' output at the output of the respective NAND gate 303a, 303b, 303c, 303d thus only becomes "logic low" when the signal rclk, rIclk, brclk, or brIclk present at the first input of the respective NAND gate 303a, 303b, 303c, 303d changes its state from "logic low" to "logic high" (and only for a relatively short duration—corresponding to the above-mentioned delay time ΔT—since, after the above-mentioned delay time ΔT, the signal present at the second input of the respective NAND gate 303a, 303b, 303c, 303d changes its state from "logic high" to "logic low"). In other words, the signal rclk', rIclk', brclk', or brIclk' output by the respective NAND gate 303a, 303b, 303c, 303d indicates that the corresponding signal rclk, rIclk, brclk, or brIclk has a positive clock edge.

As results further from FIG. 5, one input of the transmission gates 305a, 305b, 306c, 306d is connected to the supply voltage (power supply level VDLL), and one input of the transmission gates 306a, 306b, 305c, 305d to the ground (ground level VSSDL).

The outputs of the transmission gates 305a, 305b, 305c, 305d are connected with each other and are connected to an input of a latch 307b whose output is connected to the above-mentioned line 12b.

In a correspondingly similar manner, the outputs of the transmission gates 306a, 306b, 306c, 306d are connected with each other and are connected to an input of a latch 307a whose output is connected to the above-mentioned line 12a.

Each latch 307a, 307b may, for instance, comprise a first and a second inverter, wherein the output of the first inverter is fed back to the input of the first inverter via the second inverter.

At each of the four circuit sections 301a, 301b, 301c, 301d, the above-mentioned signal rclk', rIclk', brclk', or brIclk' output by the respective NAND gate 303a, 303b, 303c, 303d is directly fed to a first control input of the respective transmission gates 305a, 306a, or 305b, 306b, or 305c, 306c, or 305d, 306d, respectively, and—by the interposition of the respective inverter 304a, 304b, 304c, 304d—to a second transmission gate control input that is inverse to the first control input of the respective transmission gates 305a, 306a, or 305b, 306b, or 305c, 306c, or 305d, 306d, respectively.

Whenever one of the above-mentioned signals rclk', rIclk', brclk', or brIclk' becomes—for a short time—"logic low" (i.e. the corresponding signal rclk, rIclk, brclk, or brIclk has a positive clock edge), the corresponding transmission gates to which the respective signal rclk', rIclk', brclk', or brIclk' is fed are—for a short time—commutated correspondingly (i.e. the previously conducting transmission gate locks, and the previously locking transmission gate conducts).

The corresponding (positive or negative) pulse signal (bDO) generated thereby, or the (negative or positive) pulse signal (DO) inverse thereto, respectively, is transmitted to the input of the latch 307a or 307b, so that the signal (clk50 or bclk50) output at the output of the respective latch 307a, 307b is commutated correspondingly (i.e. changes its state from "logic high" to "logic low", or from "logic low" to "logic high").

Due to the effect of the latch 307a, 307b, the respective signal clk50, bclk50 remains in the state it has reached until the next one of the signals rclk', rIclk', brclk', or brIclk' becomes "logic low" for a short time (i.e. the corresponding signal rclk, rIclk, brclk, or brIclk has a positive clock edge).

As results from FIG. 3, with the signal clk50 or the signal bclk50—other than with the signal clk or bclk—the "logic low" state lasts substantially as long as the "logic high" state.

By means of the clock signal input/output device 1 it is thus possible to obtain, from—distorted—external clock signals clk, bclk, less distorted or substantially undistorted (clock) signals clk50 or bclk50.

The signal clk50 and/or the signal bclk50 may, for instance, be fed to a corresponding clock signal synchronizer, e.g. a DLL circuit (DLL=Delay-Locked-Loop), which generates from the clk50 signal and/or from the bclk50 signal a corresponding clock signal DQS and/or BDQS—synchronized therewith—, which is/are used for the chronological coordination of the processing and/or relaying of the data in the semiconductor device.

Figure 2:
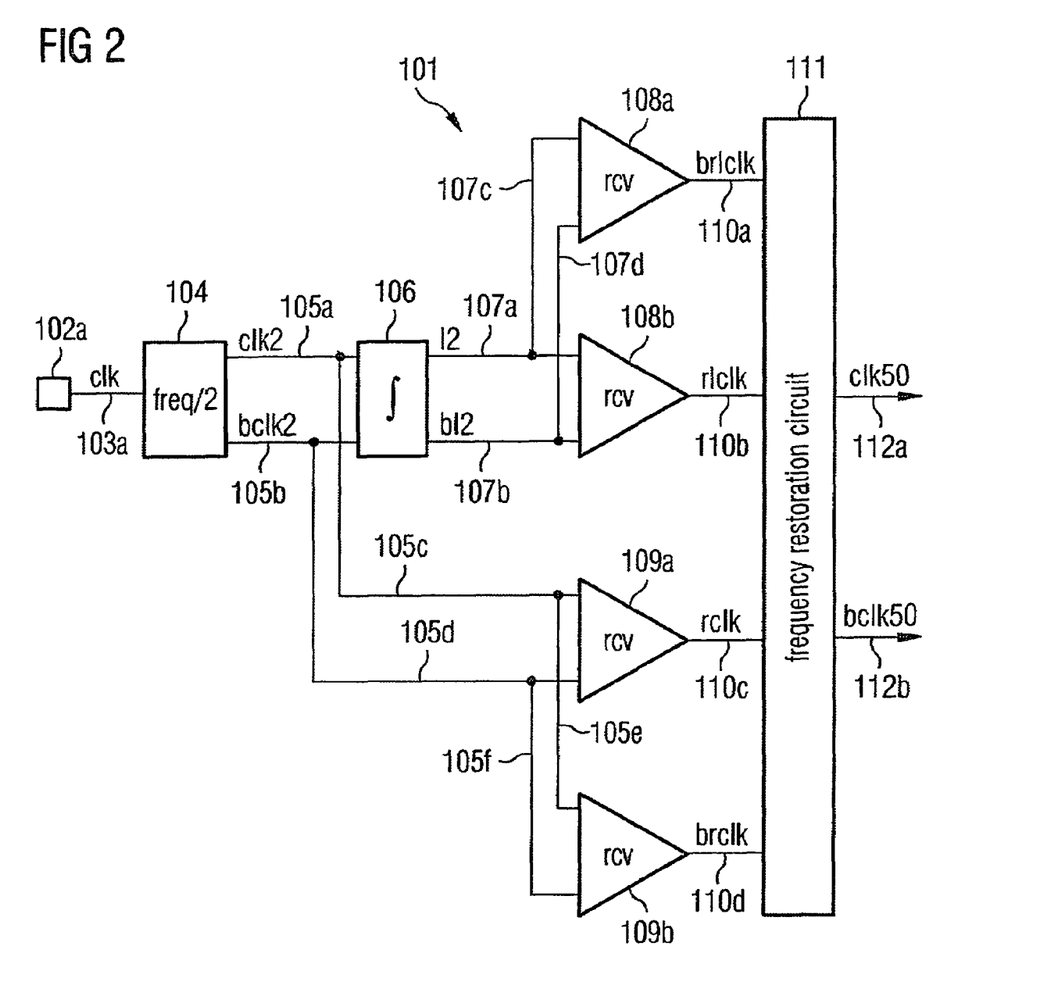
FIG. 2 shows a clock signal input/output device according to the invention.

FIG. 2 shows a schematic representation of a clock signal input/output device 101 or of a clock signal correcting device 101, respectively, according to a further embodiment of the invention.

It comprises a frequency divider 104, a signal integrator 106, four—identically or substantially identically structured—signal comparison or signal receiver circuits 108a, 108b, 109a, 109b, and a frequency restoration circuit 111.

The frequency restoration circuit 111 may, for instance, have a structure that is similar or identical to that of the frequency restoration circuit 111 illustrated in FIG. 5.

The clock signal input/output device 101 may, for instance, be provided on a semiconductor device, in particular a memory device such as a DRAM (DRAM=Dynamic Random Access Memory or dynamic read-write memory) based e.g. on CMOS technology, e.g. a DDR-DRAM (DDR-DRAM=Double Data Rate-DRAM).

The corresponding semiconductor device comprises an—external—connection 102a (e.g. an appropriate pad or an appropriate pin) at which—for the chronological coordination of the processing and/or relaying of the data in the semiconductor device—an external clock signal clk is applied by an external clock generator.

Furthermore, the device comprises a corresponding—further, not illustrated—external connection (e.g. an appropriate further pad or an appropriate further pin) at which a further external clock signal bclk is applied e.g. by the above-mentioned external clock signal generator. The clock signals clk, bclk may be oppositely inverse to each other (i.e. the clock signals may be so-called differential clock signals clk, bclk).

Internally in the device, the data may be transmitted e.g. both at the rising edge of the clk clock signal and at the rising edge of the bclk clock signal (or both at the rising edge of a DQS signal obtained therefrom and at the rising edge of a BDQS signal obtained therefrom (or—alternatively—e.g. at the respective falling clock edges of the corresponding signals)).

As is illustrated in FIG. 2, the clk signal present at the connection 102a of the semiconductor device is—possibly by the interposition of an appropriate receiver circuit—fed to an input of the frequency divider 104 via a line 103a.

A first output of the frequency divider 104—at which a signal clk2 having half the frequency f/2 of the frequency f of the signal clk is output—is connected to a first input of the signal integrator 106 via a line 105a.

By the frequency division obtained by the frequency divider 4 it is achieved that—as is illustrated in FIG. 3—the signal clk2 changes its state at a respective positive edge of the clk signal (e.g. at a first positive edge of the clk signal from "logic low" to "logic high", and at a second, subsequent positive edge of the clk signal back from "logic high" to "logic low").

A second output of the frequency divider 104 (at which a signal bclk2 having half the frequency f/2 of the frequency f of the signal clk and being oppositely inverse to the signal clk2 is output) is connected to a second input of the signal integrator 106 via a line 105b.

As results from FIG. 2, in the embodiment illustrated there—other than in the embodiment illustrated in FIG. 1—the signal bclk2 output at the line 105b is not obtained—directly—from a bclk signal that is present at the above-mentioned external semiconductor device connection, but—indirectly—from the clk signal that is inverse to the bclk signal.

By the frequency division obtained by the frequency divider 104 it is achieved that—as is illustrated in FIG. 3—the signal bclk2 changes its state at a respective positive edge of the clk signal (e.g. the signal bclk2 changes at a first positive edge of the clk signal—conversely to the signal clk2—from "logic high" to "logic low", and at a second, subsequent positive edge of the clk signal—conversely to the signal clk2—back from "logic low" to "logic high").

As results further from FIG. 2, a first output of the signal integrator 106—at which e.g. a signal I2 obtained by a corresponding integration from the signal clk is output—is connected via a line 107a and a line 107c connected therewith to a (second) input of the above-mentioned signal comparison circuit 108a.

As results further from FIG. 2, the first output of the signal integrator 106 is—additionally—(via the above-mentioned line 107a) connected to a first input of the above-mentioned signal comparison circuit 108b which is inverse to the above-mentioned second input of the above-mentioned signal comparison circuit 108a.

Furthermore, a second output of the signal integrator 106—at which a signal bI2 obtained e.g. by a corresponding integration from the signal bclk and proceeding inversely to the signal I2 is output—is, via a line 107b and a line 107d connected therewith, connected to a first input of the above-mentioned signal comparison circuit 108a.

As results further from FIG. 2, the second output of the signal integrator 106 is—additionally—(via the above-mentioned line 107b) connected to a second input of the above-mentioned signal comparison circuit 108b.

As signal comparison or signal receiver circuits 108a, 108b, 109a, 109b, any signal comparison circuits or signal receiver circuits may, on principle, be used, e.g. receiver circuits that are constructed correspondingly similar as corresponding conventional clock receiver circuits, comprising e.g. four cross-coupled transistors (e.g. a first and a second p-channel field effect transistor, and a first and a second n-channel field effect transistor).

The sources of the first and second n-channel field effect transistors may, for instance, be connected to a (direct or constant) current source that is e.g. connected with the mass potential.

Furthermore, the gate of the first n-channel field effect transistor may, for instance, be connected with the above-mentioned (first) input of the respective circuit 108a, 108b, 109a, 109b, and the gate of the second n-channel field effect transistor with the above-mentioned (second) input of the respective circuit 108a, 108b, 109a, 109b.

The drain of the first n-channel field effect transistor may, for instance, be connected to the gate of the first and second p-channel field effect transistors, and to the drain of the first p-channel field effect transistor, as well as to a (first) output of the respective circuit 108a, 108b, 109a, 109c (at which—as is illustrated in FIG. 2—e.g. a signal brIclk, rIclk, rclk, or brclk may be tapped at the circuits 108a, 108b, 109a, 190c (the corresponding signals output at the respective second output of the circuits 108a or 109b are not used in the present embodiment)).

Correspondingly, the drain of the second n-channel field effect transistor may, for instance, be connected to the drain of the second p-channel field effect transistor, and to the (second) output of the respective circuit 108a, 108b, 109a, 109c (which is not used in the present embodiment).

The sources of the first and second p-channel field effect transistors may, for instance, each be connected to the supply voltage.

The first output of the signal comparison circuit 108a is—via a line 110a—connected to the above-mentioned frequency restoration circuit 111.

Correspondingly, the above-mentioned first output of the signal comparison circuit 108b is connected to the above-mentioned frequency restoration circuit 111 via a line 110b.

As results further from FIG. 2, the above-mentioned signal clk2—which has half the frequency f/2 of the frequency f of the signal clk—is fed, except via the line 105a to the first input of the signal integrator 106, additionally via a line 105c that is connected to the line 105a to a first input of the above-mentioned signal comparison circuit 109, and—via a line 105e that is connected to the line 105c—to a second input of the above-mentioned signal comparison circuit 109b.

Furthermore, the above-mentioned signal bclk2—which has half the frequency f/2 of the frequency f of the signal bclk—is fed, except via the line 105b to the second input of the signal integrator 106, additionally via a line 105d that is connected to the line 105b to a second input of the above-mentioned signal comparison circuit 109a, and—via a line 105f that is connected to the line 105d—to a first input of the above-mentioned signal comparison circuit 109b.

A first output of the signal comparison circuit 109a is—via a line 110c—connected to the above-mentioned frequency restoration circuit 111.

Correspondingly, a first output of the signal comparison circuit 109b is connected via a line 110d to the above-mentioned frequency restoration circuit 111.

As is illustrated in FIG. 3, and as has already been mentioned above, the signals clk2 or bclk2, respectively, present at the line 105a or 105b, respectively, are integrated by the signal integrator 106.

The level of the signal I2 output by the signal integrator 106 at the line 107a therefore continues to increase linearly in the form of a ramp—from the time at which a negative edge occurs with the signal clk2—until a time at which a positive edge occurs with the signal clk2, which results in that—until the next negative edge of the clk2 signal—the level of the signal I2 output by the signal integrator 106 at the line 107a continues to decrease linearly in the form of a ramp.

The level of the signal bI2 output by the signal integrator 106 at the line 107b correspondingly inversely continues to decrease linearly in the form of a ramp—from the time at which a negative (or, with the signal bclk2, a positive) edge occurs with the signal clk2—until the time at which a positive (or, with the signal bclk2, a negative) edge occurs with the signal clk2, which results in that—until the next negative edge of the clk2 signal—the level of the signal bI2 output by the signal integrator 106 at the line 107b continues to increase linearly in the form of a ramp.

As results further from FIG. 3, a signal clk50 output by the frequency restoration circuit 111 at a line 112a changes its state from "logic low" to "logic high" when the signal rclk that is present at the line 110c changes its state from "logic low" to "logic high", and already then back to "logic low" when the signal rIclk that is present at the line 110b changes its state from "logic low" to "logic high". Furthermore, the signal clk50 output by the frequency restoration circuit 111 at the line 112a already changes its state from "logic low" to "logic high" when the signal brclk that is present at the line 110d changes its state from "logic low" to "logic high", and already then back to "logic low" when the signal brIclk that is present at the line 110a changes its state from "logic low" to "logic high" (in other words, there is a change of the signal state of the signal clk50 whenever one of the signals rclk, rIclk, brclk, or brIclk has a positive clock edge).

For the signal bclk50 output by the frequency restoration circuit 111 at a line 112b, what has been explained above for the signal clk50 applies vice versa.

The mode of operation of the clock signal input/output device 101 illustrated in FIG. 2 thus corresponds substantially to the mode of operation of the clock signal input/output device 1 illustrated in FIG. 1, except that the signals brIclk and rIclk, or rclk and brclk, respectively, are each generated by two different instead of by one and the same signal comparison or receiver circuits 108a, 108b, 109a, 109b, wherein all positive edges of the—here used—output signals brIclk and rIclk, or rclk and brclk, respectively, of the receiver circuits 108a, 108b, 109a, 109b are each exclusively triggered by corresponding positive edges of the corresponding signals (I2 and bI2, or clk2 and bclk2, respectively) controlling the receiver circuits 108a, 108b, 109a, 109b (and not either by positive or by negative edges of the control signals I2 and bI2, or clk2 and bclk2, respectively).

Thus, it can be prevented that distortions with the signals clk50, bclk50 output by the frequency restoration circuit 111 are caused by the receiver circuits 108a, 108b, 109a, 109b due to signal running times that are possibly differing with positive and negative edges of the control signals I2 and bI2, or clk2 and bclk2, respectively.

Figure 4:
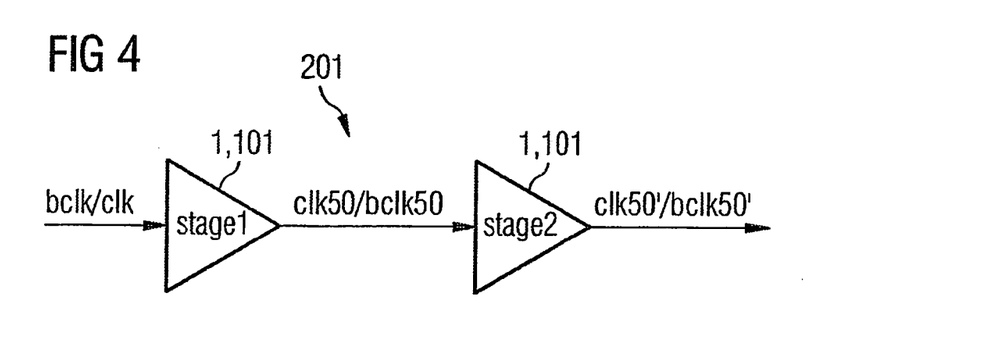
FIG. 4 shows a system for correcting clock signals according to the invention.

As results from FIG. 4, a plurality of clock signal input/output devices 1, 101 corresponding to the clock signal input/output devices 1, 101 illustrated in FIG. 1 and/or FIG. 2 can be connected in series (e.g. two or three, etc. clock signal input/output devices 1, 101).

The signals clk50, bclk50 output by a first clock signal input/output device 1, 101 are used as input signals for a second clock signal input/output device 1, 101 that is connected behind the first clock signal input/output device 1, 101, so that distortions that may still be contained in the signals clk50, bclk50 can be even further reduced by the—second clock signal input/output device 1, 101.

List of Reference Signs
1 clock signal input/output device
2a connection
2b connection
3a line
3b line
4 frequency divider
5a line
5b line
5c line
5d line
6 signal integrator
7a line
7b line
8 signal comparison circuit
9 signal comparison circuit
10a line pair
10b line pair
11 frequency restoration circuit
12a line
12b line
101 clock signal input/output device
102a connection
103a line
104 frequency divider
105a line
105b line
105c line
105d line
105e line
105f line
106 signal integrator
107a line
107b line
107c line
107d line
108a signal comparison circuit
108b signal comparison circuit
109a signal comparison circuit
109b signal comparison circuit
110a line
110b line
110c line
110d line
111 frequency restoration circuit
112a line
112b line
201 clock signal input/output system
301a circuit section
301b circuit section
301c circuit section
301d circuit section
302a delay means
302b delay means
302c delay means
302d delay means
303a NAND gate
303b NAND gate
303c NAND gate
303d NAND gate
304a inverter 304b inverter
304c inverter
304d inverter
305a transmission gate
305b transmission gate
305c transmission gate
305d transmission gate
306a transmission gate
306b transmission gate
306c transmission gate
306d transmission gate
307a latch
307b latch

What is claimed is:

1. A clock signal input/output device, comprising:
a frequency divider into which a clock signal or a signal obtained therefrom is input;
a signal integrator to receive a signal output by the frequency divider or a signal obtained therefrom;
a first signal comparison circuit to receive a signal output by the signal integrator or a signal obtained therefrom;
a second signal comparison circuit to be sent or receive the signal output by the frequency divider or the signal obtained therefrom;
a signal output circuit for outputting a clock output signal as a function of a signal output by the first signal comparison circuit, and of a signal output by the second signal comparison circuit.

2. The clock signal input/output device according to claim 1, wherein the clock output signal output by the signal output circuit further depends on another signal output by the first signal comparison circuit, and on a signal output by the second signal comparison circuit.

3. The clock signal input/output device according to claim 1, wherein the clock output signal output by the signal output device further depends on a signal output by a third signal comparison circuit, and on a signal output by a fourth signal comparison circuit.

4. The clock signal input/output device according to claim 1, wherein one or a plurality of the signal comparison circuits are receiver circuits.

5. The clock signal input/output device according to claim 4, wherein the one or the plurality of receiver circuits comprise cross-coupled transistors.

6. The clock signal input/output device according to claim 1, wherein the clock output signal output by the signal output circuit changes its state, at a positive edge of the signal output by the second signal comparison device, from logical low to logical high, or from logical high to logical low, and at a subsequent positive edge of the signal output by the first signal comparison circuit, back to logical low or logical high.

7. The clock signal input/output device according to claim 5, wherein the clock output signal output by the signal output circuit changes its state, at a negative edge of the signal output by the second signal comparison circuit, from logical low to logical high, or from logical high to logical low, and at a subsequent negative edge of the signal output by the first signal comparison circuit back to logical low or logical high.

8. A clock signal correction method, comprising:
dividing the frequency of a clock signal so that a signal with a lower frequency vis-à-vis the frequency of the clock signal is obtained;
integrating the signal with the lower frequency so that an integration signal is obtained;
comparing the signal with the lower frequency with a signal that is inverse thereto; and
comparing the integration signal with a signal that is inverse thereto.

9. A clock signal input/output device, comprising:
a frequency divider to receive a clock signal;
a signal integrator to receive a signal output by the frequency divider or a signal obtained therefrom;
a first signal comparison circuit to receive a signal output by the signal integrator or a signal obtained therefrom;
a second signal comparison circuit to receive the signal output by the frequency divider or the signal obtained therefrom; and
a signal output circuit for outputting a clock output signal as a function of a signal output by the first signal comparison circuit, and a signal output by the second signal comparison circuit, wherein a signal edge of the clock output signal extending in a first direction is triggered by a signal edge of the signal output by the second signal comparison circuit, and a second signal edge of the clock output signal extending in a second direction opposite to the first direction is triggered by a signal edge of the signal output by the first signal comparison circuit.

10. A clock signal correction method, comprising:
dividing the frequency of a clock signal so that a signal with a lower frequency vis-à-vis the frequency of the clock signal is obtained;
integrating the signal with the lower frequency, so that an integration signal is obtained;
comparing the signal with the lower frequency with a signal that is inverse thereto, so that a first comparison signal is obtained;
comparing the integration signal with a signal that is inverse thereto, so that a second comparison signal is obtained; and
outputting a clock output signal, wherein a signal edge of the clock output signal extending in a first direction is triggered by a signal edge of the first comparison signal, and a signal edge of the clock output signal extending in a second direction opposite to the first direction is triggered by a signal edge of the second comparison signal.

* * * * *

UNITED STATES PATENT AND TRADEMARK OFFICE
CERTIFICATE OF CORRECTION

PATENT NO.       : 7,227,396 B2
APPLICATION NO. : 11/374990
DATED            : June 5, 2007
INVENTOR(S)      : Minzoni

It is certified that error appears in the above-identified patent and that said Letters Patent is hereby corrected as shown below:

On the Title Page, insert item (30):
    (30)        Foreign Application Priority Data
    Nov. 24, 2003    (DE) .............................. 103 54 818.1

Col. 2, line 14, delete "form" and insert --from--.
Col. 2, lines 17 and 18, delete "signal (s)" and insert --signal(s)--.
Col. 2, line 61, delete "to provides" and insert --provides--.
Col. 2, line 65, delete "a distorted" and insert --distorted--.
Col. 4, line 37, delete "12 obtained" and insert --I2 is obtained--.
Col. 4, line 42, delete "obtained" and insert --is obtained--.
Col. 6, line 26, delete "level o" and insert --level of--.
Col. 10, line 20, delete "109$c$" and insert --109$b$--.
Col. 10, line 22, delete "190$c$" and insert --109$b$--.
Col. 10, line 30, delete "109$c$" and insert --109$b$--.
Col. 11, line 54, delete "12" and insert --I2--.
Col. 11, line 59, delete "12" and insert -I2--.
Col. 13, line 22, delete "to be sent" and insert --to send--.

Signed and Sealed this

Sixth Day of November, 2007

JON W. DUDAS
*Director of the United States Patent and Trademark Office*